US008669818B2

(12) United States Patent
Le Grand De Mercey

(10) Patent No.: US 8,669,818 B2
(45) Date of Patent: *Mar. 11, 2014

(54) WAVE REVERSING SYSTEM AND METHOD FOR A ROTARY TRAVELING WAVE OSCILLATOR

(75) Inventor: Gregoire Le Grand De Mercey, Menlo Park, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/460,552

(22) Filed: Apr. 30, 2012

(65) Prior Publication Data

US 2012/0212297 A1  Aug. 23, 2012

Related U.S. Application Data

(63) Continuation of application No. 12/532,628, filed as application No. PCT/US2008/058726 on Mar. 28, 2008, now Pat. No. 8,169,267.

(60) Provisional application No. 60/908,959, filed on Mar. 29, 2007.

(51) Int. Cl.
*H03K 3/03* (2006.01)

(52) U.S. Cl.
USPC ..................................... 331/57; 331/107 SL

(58) Field of Classification Search
USPC .................. 331/45, 46, 55, 57, 96, 107 SL
See application file for complete search history.

(56) References Cited

U.S. PATENT DOCUMENTS

| 3,516,021 A | 6/1970 | Kohn |
| 3,538,450 A | 11/1970 | Andrea et al. |
| 4,086,543 A | 4/1978 | Nigrin |
| 4,246,550 A | 1/1981 | Cohen |
| 4,514,707 A | 4/1985 | Dydyk et al. |

(Continued)

FOREIGN PATENT DOCUMENTS

| DE | 4322701 | 8/1994 |
| EP | 0478134 | 8/1991 |

(Continued)

OTHER PUBLICATIONS

Kato, Hatsuhiro, "A Dynamic Formulation of Ring Oscillator as Solitary-Wave Propagator," *IEEE Transactions on Circuits and Systems-I: Fundamental Theory and Applications*, vol. 45, No. 1, Jan. 1998, pp. 98-101.

(Continued)

*Primary Examiner* — Levi Gannon
(74) *Attorney, Agent, or Firm* — Knobbe Martens Olson & Bear LLP

(57) ABSTRACT

Apparatus and methods for wave reversing in a travelling wave oscillator are disclosed. The travelling wave oscillator includes a differential transmission line and regeneration elements connected along the differential transmission line. The differential transmission line can be used to propagate a wave traveling in either a counterclockwise or a clockwise direction. Each of the regeneration elements includes a first gain portion operable to degenerate a wave travelling in the counterclockwise direction and to regenerate a wave travelling the clockwise direction, and a second gain portion operable to degenerate a wave travelling in a clockwise direction and to regenerate a wave travelling in a counterclockwise direction.

19 Claims, 10 Drawing Sheets

(56) References Cited

U.S. PATENT DOCUMENTS

| | | |
|---|---|---|
| 4,686,407 A | 8/1987 | Ceperley |
| 4,749,963 A | 6/1988 | Makimoto et al. |
| 4,875,046 A | 10/1989 | Lewyn |
| 5,117,206 A | 5/1992 | Imamura |
| 5,235,335 A | 8/1993 | Hester et al. |
| 5,302,920 A | 4/1994 | Bitting |
| 5,361,277 A | 11/1994 | Grover |
| 5,493,715 A | 2/1996 | Humphreys et al. |
| 5,584,067 A | 12/1996 | V. Buer et al. |
| 5,592,126 A | 1/1997 | Boudewijns et al. |
| 5,640,112 A | 6/1997 | Goto et al. |
| 5,652,549 A | 7/1997 | Unterricker et al. |
| 5,677,599 A | 10/1997 | Wood |
| 5,754,833 A | 5/1998 | Singh et al. |
| 5,825,211 A | 10/1998 | Smith et al. |
| 5,945,847 A | 8/1999 | Ransijn |
| 5,963,086 A | 10/1999 | Hall |
| 5,973,633 A | 10/1999 | Hester |
| 6,002,274 A | 12/1999 | Smith et al. |
| 6,078,202 A | 6/2000 | Tomatsuri et al. |
| 6,133,798 A | 10/2000 | Nagano et al. |
| 6,150,886 A | 11/2000 | Shimomura |
| 6,157,037 A | 12/2000 | Danielson |
| 6,239,663 B1 | 5/2001 | Mizutani |
| 6,259,327 B1 | 7/2001 | Balistreri et al. |
| 6,259,747 B1 | 7/2001 | Gustafsson et al. |
| 6,281,759 B1 | 8/2001 | Coffey |
| 6,323,737 B1 | 11/2001 | Broekaert |
| 6,396,359 B1 | 5/2002 | Hajimiri et al. |
| 6,426,662 B1 | 7/2002 | Arcus |
| 6,525,618 B2 | 2/2003 | Wood |
| 6,556,089 B2 * | 4/2003 | Wood ............... 331/57 |
| 6,566,968 B2 | 5/2003 | Afghahi |
| 6,683,503 B2 | 1/2004 | Mizuno et al. |
| 6,781,424 B2 | 8/2004 | Lee et al. |
| 6,816,020 B2 | 11/2004 | Wood |
| 6,853,260 B1 * | 2/2005 | Hajimiri et al. ............. 331/96 |
| 6,856,208 B2 | 2/2005 | Lee et al. |
| 6,870,431 B2 | 3/2005 | Afghahi |
| 6,900,699 B1 | 5/2005 | Kim |
| 6,943,599 B2 | 9/2005 | Ngo |
| 6,995,620 B2 | 2/2006 | Afghahi |
| 7,005,930 B1 | 2/2006 | Kim et al. |
| 7,085,668 B2 | 8/2006 | Johnson |
| 7,088,154 B2 | 8/2006 | Ngo |
| 7,091,802 B2 | 8/2006 | Ham et al. |
| 7,130,604 B1 | 10/2006 | Wong et al. |
| 7,203,914 B2 * | 4/2007 | Wood ............... 716/113 |
| 7,218,180 B2 | 5/2007 | Wood |
| 7,224,199 B1 | 5/2007 | Kang |
| 7,224,235 B2 | 5/2007 | De Ranter et al. |
| 7,236,060 B2 | 6/2007 | Wood |
| 7,242,272 B2 | 7/2007 | Ham et al. |
| 7,274,262 B2 | 9/2007 | Ham et al. |
| 7,295,076 B2 | 11/2007 | Kim et al. |
| 7,307,483 B2 | 12/2007 | Tzartzanis et al. |
| 7,315,219 B2 | 1/2008 | Chiang |
| 7,339,439 B2 | 3/2008 | Roubadia et al. |
| 7,378,893 B1 | 5/2008 | Kang |
| 7,397,230 B2 | 7/2008 | Tabaian et al. |
| 7,409,012 B2 | 8/2008 | Martin et al. |
| 7,446,578 B2 | 11/2008 | Huang |
| 7,471,153 B2 | 12/2008 | Kee et al. |
| 7,482,883 B2 | 1/2009 | Wang et al. |
| 7,504,895 B2 | 3/2009 | Neidorff |
| 7,511,588 B2 | 3/2009 | Gabara |
| 7,513,873 B2 | 4/2009 | Shifrin |
| 7,515,005 B2 | 4/2009 | Dan |
| 7,541,794 B2 | 6/2009 | Tabaian et al. |
| 7,545,225 B2 | 6/2009 | Beccue |
| 7,551,038 B2 | 6/2009 | Jang et al. |
| 7,571,337 B1 | 8/2009 | Zhai et al. |
| 7,577,225 B2 | 8/2009 | Azadet et al. |
| 7,609,756 B2 | 10/2009 | Wood |
| 7,612,621 B2 | 11/2009 | Kim et al. |
| 7,616,070 B2 | 11/2009 | Tzartzanis et al. |
| 7,656,239 B2 | 2/2010 | Bietti et al. |
| 7,656,336 B2 | 2/2010 | Wood |
| 7,656,979 B2 | 2/2010 | Leydier et al. |
| 7,663,328 B2 | 2/2010 | Gonder |
| 7,715,143 B2 | 5/2010 | Bliss et al. |
| 7,741,921 B2 | 6/2010 | Ismailov |
| 7,782,988 B2 | 8/2010 | Ziesler |
| 7,833,158 B2 | 11/2010 | Bartz |
| 7,847,643 B2 | 12/2010 | Da Dalt |
| 7,885,625 B2 | 2/2011 | Muhammad et al. |
| 7,893,778 B2 | 2/2011 | Mohtashemi et al. |
| 7,907,023 B2 | 3/2011 | Liang et al. |
| 7,911,284 B2 | 3/2011 | Kuwano |
| 7,924,076 B2 | 4/2011 | Suzuki et al. |
| 7,936,193 B2 | 5/2011 | Van Der Wel et al. |
| 7,944,316 B2 | 5/2011 | Watanabe et al. |
| 7,952,439 B1 | 5/2011 | Heggemeier et al. |
| 7,973,609 B2 | 7/2011 | Ohara et al. |
| 7,995,364 B2 | 8/2011 | Shiu |
| 8,008,981 B2 | 8/2011 | Hong et al. |
| 8,049,563 B2 | 11/2011 | Aoki et al. |
| 8,081,035 B2 | 12/2011 | Wood |
| 8,089,322 B2 * | 1/2012 | Beccue et al. ............... 331/96 |
| 8,169,267 B2 | 5/2012 | Le Grand De Mercey |
| 2003/0006851 A1 | 1/2003 | Wood |
| 2004/0222859 A1 | 11/2004 | Hajimiri et al. |
| 2006/0208776 A1 | 9/2006 | Tonietto et al. |
| 2008/0074202 A1 | 3/2008 | Gabara |
| 2009/0322394 A1 | 12/2009 | Song et al. |
| 2010/0117744 A1 | 5/2010 | Takinami et al. |
| 2010/0156549 A1 | 6/2010 | Uemura et al. |
| 2010/0321121 A1 | 12/2010 | Mohtashemi |
| 2011/0095833 A1 | 4/2011 | Mohtashemi et al. |
| 2011/0156760 A1 | 6/2011 | Bhuiyan et al. |
| 2011/0156773 A1 | 6/2011 | Beccue |
| 2011/0195683 A1 | 8/2011 | Brekelmans et al. |
| 2011/0286510 A1 | 11/2011 | Levantino et al. |
| 2012/0008717 A1 | 1/2012 | van Sinderen et al. |
| 2012/0013363 A1 | 1/2012 | Takinami et al. |
| 2012/0013407 A1 | 1/2012 | Takinami et al. |
| 2012/0025918 A1 | 2/2012 | Wang et al. |

FOREIGN PATENT DOCUMENTS

| | | |
|---|---|---|
| EP | 0891045 | 1/1999 |
| GB | 01/02069 | 11/2001 |
| JP | 60224205 | 11/1985 |
| JP | 04165809 | 6/1992 |
| WO | WO 2008/121857 A1 | 10/2008 |

OTHER PUBLICATIONS

Nagashino, Hirofumi, et al., "Generation of Traveling Wave Mode in a Chained Neural Oscillator Network Model," *IEEE*, Proc. of the Int. Conference on Neural Networks (ICNN), New York, Mar. 1993, pp. 1550-1557.

Yabuki, Hiroyuki, et al., "Miniaturized Stripline Dual-Mode Ring Resonators and Their Application to Oscillating Devices," *IEEE MIT-S International Microwave Symposium Digest*, New York, May 16. 1995, pp. 1313-1316.

Wood, et al., "Rotary Traveling-Wave Oscillator Arrays: A New Clock Technology," *IEEE J Solid-State Circuits*, vol. 36, No. 11, Nov. 2001, pp. 1654-1665.

International Preliminary Report and Written Opinion of the International Searching Authority in PCT Appl. No. PCT/US2008/058726, dated Sep. 29, 2009, 4 pages.

* cited by examiner

WAVE REVERSING SYSTEM AND METHOD FOR A ROTARY TRAVELING WAVE OSCILLATOR

This application is a continuation of U.S. patent application Ser. No. 12/532,628, filed on Sep. 22, 2009, titled "WAVE REVERSING SYSTEM AND METHOD FOR A ROTARY TRAVELING WAVE OSCILLATOR", which is a national stage entry of PCT/US2008/058726, filed on Mar. 28, 2008, titled "WAVE REVERSING SYSTEM AND METHOD FOR A ROTARY TRAVELING WAVE OSCILLATOR", which claims the benefit of U.S. Provisional Patent Application Ser. No. 60/908,959, filed on Mar. 29, 2007, titled "WAVE REVERSING SYSTEM AND METHOD FOR A ROTARY TRAVELING WAVE OSCILLATOR", the disclosures of which are each hereby incorporated by reference in their entireties herein.

BACKGROUND

A rotary traveling wave oscillator is described in U.S. Pat. No. 6,556,089, which is incorporated by reference into the present application. In that patent, a wavefront moves around a closed, differential loop, reversing its polarity in each transit of the loop. The wavefront traveling on the loop is established and maintained by a plurality of regeneration elements, such as back-to-back inverters, distributed about the entire loop, in one embodiment. FIG. 1 shows an embodiment 10 of a back-to-back inverter 12, 14. The result of this arrangement is that at any point on the differential loop, a differential clock signal is available. The frequency of the clock signal is determined by the electrical size of the loop, by which is meant the time it takes to make a lapse around the loop, given the loop's loaded transmission line characteristics.

PCT/GB01/02069, which is incorporated by reference into the present application, describes an embodiment, shown in FIG. 12B, in which circuitry biases the wave so that it travels in a preferred direction, either clockwise or counter clockwise. According to this application, the direction of the traveling wave is not changeable once the wave had been established on the loop. See PCT/GB01/02069, page 7, lines 24-25. That is, to change the direction of the wave, one would have to cycle power the loop and re-start the wave in the opposite direction. While this startup circuitry accomplishes the function of assuring that the traveling wave moves in a preferred direction, it would be desirable to establish the direction of the traveling wave without cycling power the loop, i.e., to change the direction of the wave in real time.

SUMMARY OF INVENTION

The present invention, in one embodiment, is directed towards circuitry that can change the direction of the traveling wave on the rotary oscillator without having to power down the loop, in effect, changing the direction of the wave in real time, i.e., while the wave is traveling in either one of the directions. The present invention includes one or more regeneration/degeneration elements, each of which includes circuitry for regenerating or degenerating a wave traveling in a particular direction. The new regeneration/degeneration elements employ a positive resistance to degenerate a wave traveling in a particular direction and negative resistance to establish and maintain the wave in the opposite direction.

The present invention in another embodiment is directed towards circuitry that can establish a wave on a rotary oscillator traveling in a preferred direction. The present invention includes one or more regeneration/degeneration elements, each of which includes circuitry for regenerating a wave traveling in the preferred direction and degenerating a wave traveling opposite to the preferred direction.

BRIEF DESCRIPTION OF DRAWINGS

These and other features, aspects and advantages of the present invention will become better understood with regard to the following description, appended claims, and accompanying drawings where:

DETAILED DESCRIPTION

Figure 1:
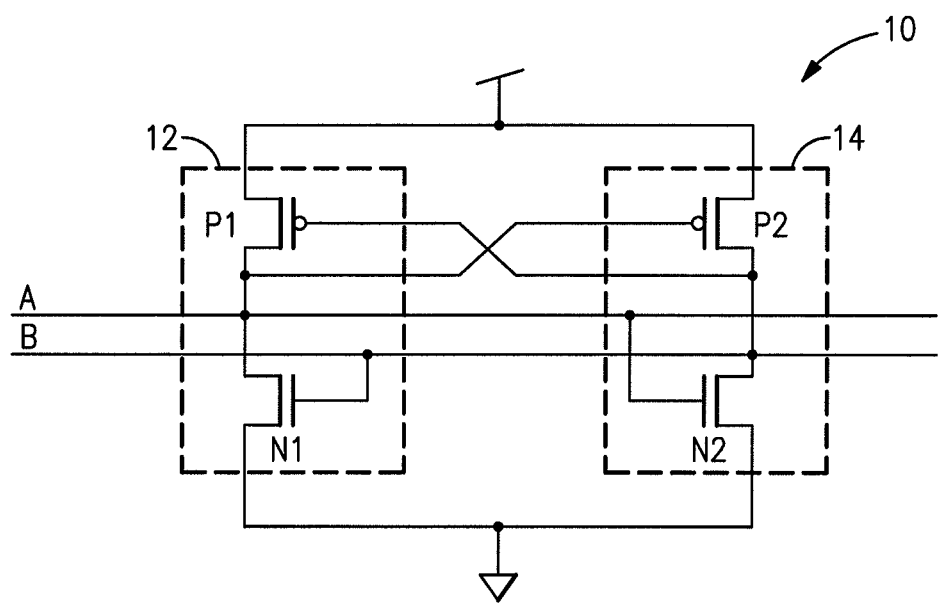
FIG. 1 shows a prior art circuit for a regeneration device.
Figure 2A:
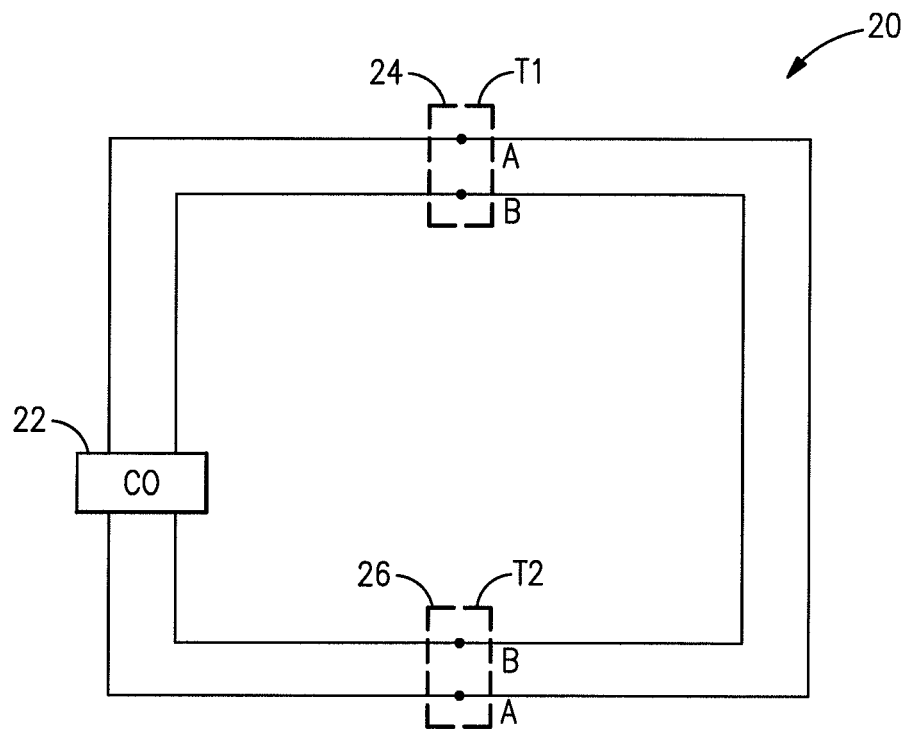
FIG. 2A shows a simplified diagram of the rotary traveling wave oscillator.

FIG. 2A shows a simplified diagram of the rotary traveling wave oscillator 20. The oscillator 20 includes one or more regeneration/degeneration elements (shown in FIG. 7) and a crossover CO 22, which reverses the polarity of a differential wave traveling on the conductors of the oscillator. The figure also shows two points T1 24 and T2 26 at which the conductors of the oscillator are tapped by a representative regeneration/degeneration element ("redegen" element).

In the discussion that follows, a convention for naming the wavefront is helpful. The relatively more positive wavefront is named the 0 degree wavefront, so that 180 degrees is the relatively more negative wavefront. A traveling wave thus has the following wavefronts that travel past a specific point, 0, 90, 180, 270, 360.

Figure 2B:
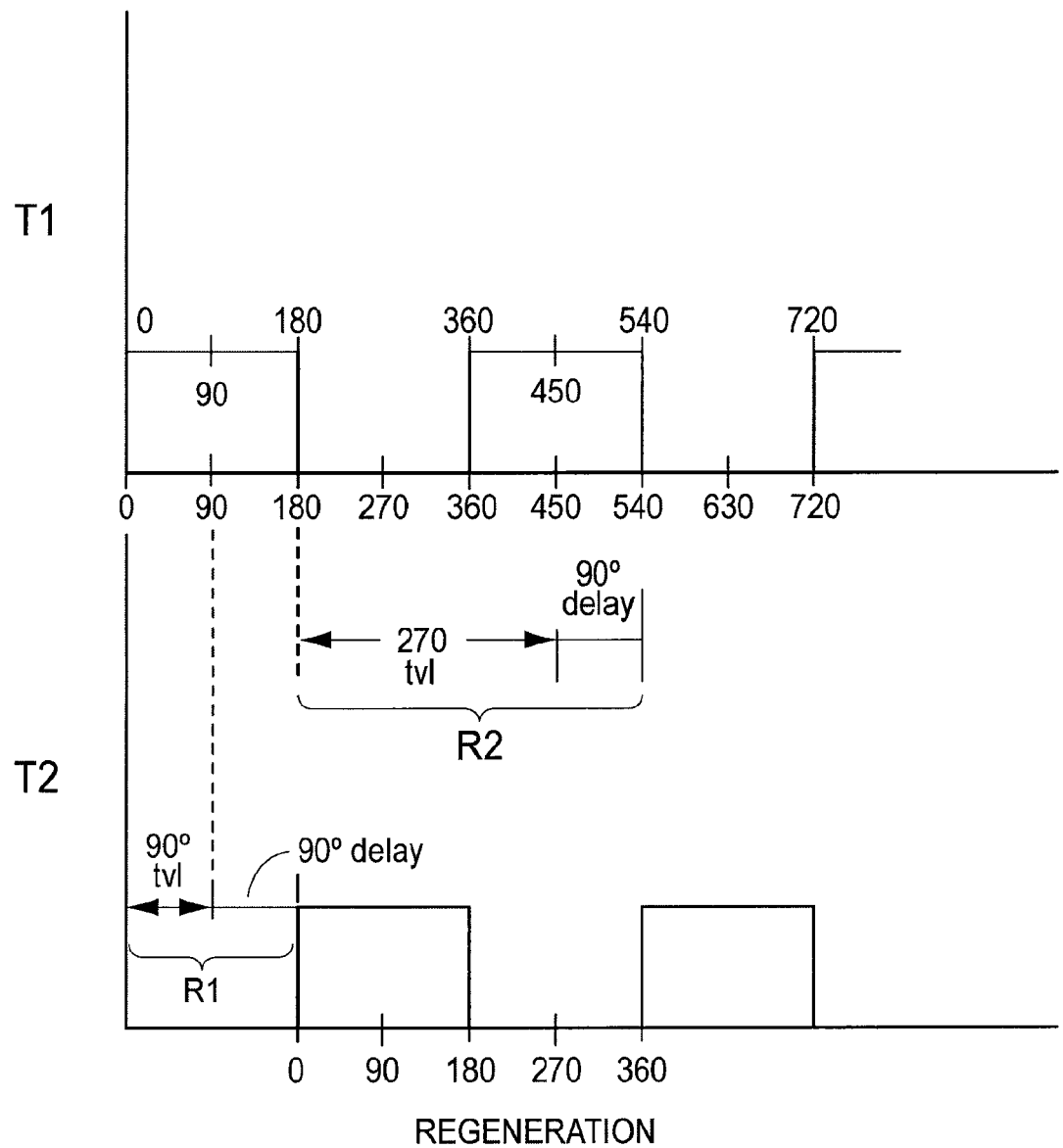
FIGS. 2B and 2C are timing diagrams that illustrate cases of regeneration and degeneration of a traveling wave.
Figure 2C:
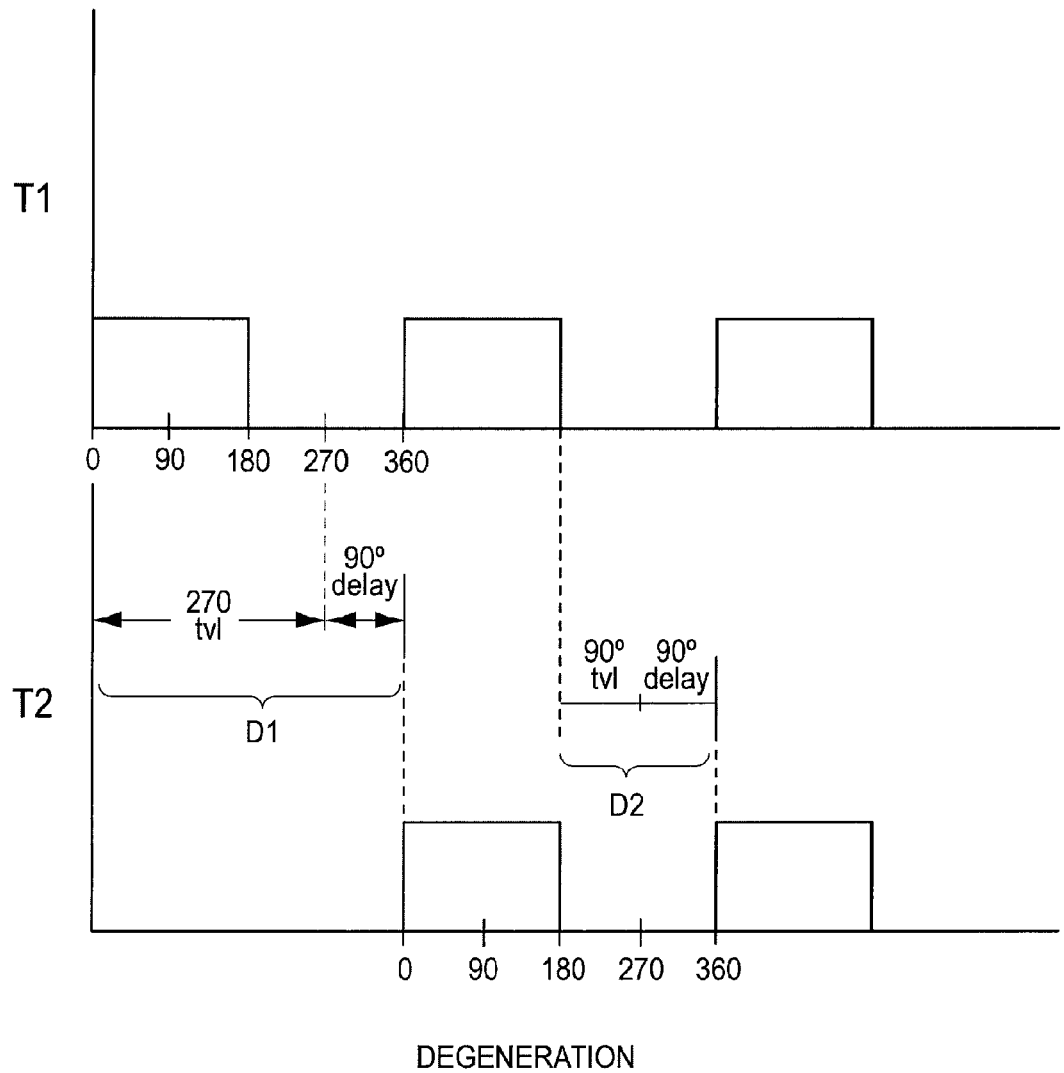

FIGS. 2B and 2C are timing diagrams that illustrate the cases in which regeneration or degeneration of a wave occurs. FIG. 2B shows the cases where there is regeneration and FIG. 2C shows the cases where there is degeneration.

Regeneration occurs, as illustrated in FIG. 2B, when the wave at T1 is 180 degrees out of phase with the wave at T2. There are two cases. The first case occurs when a 0 degree T2 wavefront at T2 has traveled 90 degrees from the 0 degree wavefront at T1, and a 90 degree external delay is added. The second case occurs when a 180 degree wavefront at T2 wave has traveled 270 degrees from the 180 degree wavefront at T1 wave, and a 90 degrees external delay is added. These two conditions, R1 and R2 in FIG. 2B, are expressed as follows, R1(0+$\vec{90}$,+90), R2(180+$\vec{270}$,+90), where the arrow indicates a delay caused by the travel of the wave and the +90 indicate a delay caused by delay external to the oscillator.

Degeneration occurs, as illustrated in FIG. 2C, when the wave at T1 is in phase with the wave at T2. Again, there are two cases to consider. In the first case, a 0 degree wavefront at T2 wave has traveled 270 degrees from the 0 degree wavefront at T1 wave, and a 90 degree delay is added. In the second case, the 180 degree wavefront at T2 has traveled 90 degrees from the 180 degree wavefront at T1, and a 90 degree delay is added. These two conditions D1, D2, are expressed as D1(0+ $\overrightarrow{270}$,+90), D2(180+$\overrightarrow{90}$,+90).

Figure 3:
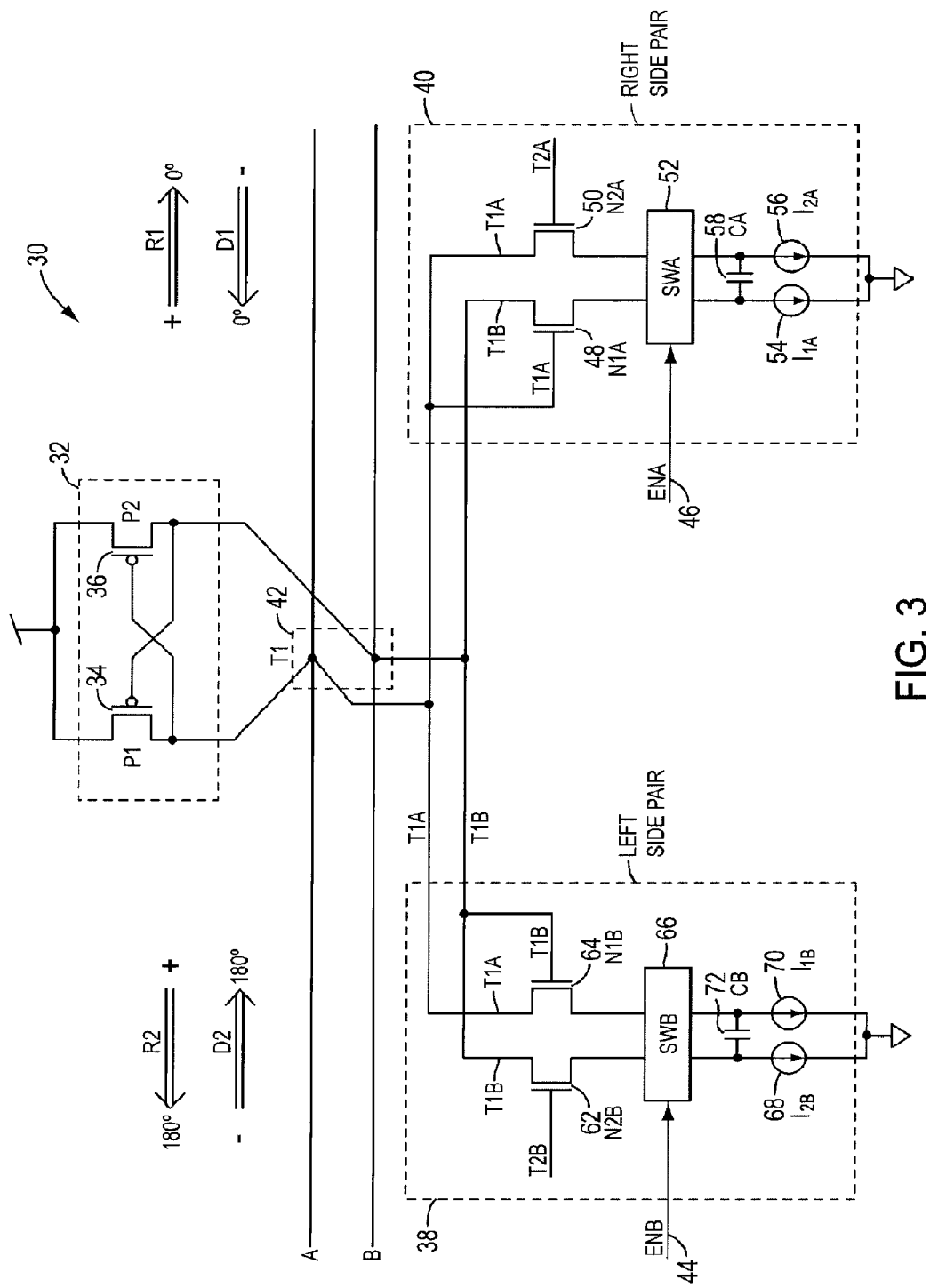
FIG. 3 shows a simplified diagram of an embodiment of the present invention.

FIG. 3 shows a simplified diagram of a representative regeneration/degeneration element 30 of the present invention. In this element, there is a pair of load devices 32, such as PFETs P1 34 and P2 36 that are cross-coupled to each other, and two pairs 38, 40 of transistors on either side of the load devices 32. Alternatively, the load devices 32 can be resistors, NMOS devices with resistive loading, or NMOS devices with PMOS diodes. Active load devices need only to provide a gain over a phase range of 0 to 180 degrees. The transistor pairs 38, 40 are connected to the A and B conductors at the same tap point (T1) 42 as the load devices.

The right side transistor pair 40 is configured to supply energy to a wave traveling in the clockwise direction (to the right in the figure), and to remove energy from a wave traveling in the counter clockwise direction (to the left in the figure). The left side transistor pair 38 is configured to supply energy to a wave traveling in the counter clockwise direction (to the left in the figure) and to remove energy from a wave traveling in the clockwise direction. The operation of each pair is selectable by an enable signal EN 44, 46. Only one pair is operative at a time.

The right side pair of transistors includes two NFETs N1A 48 and N2A 50. The first NFET N1A 48 has its gate connected to T1A, which is the A conductor at tap point T1 42, and its drain connected to T1B, the B conductor at the T1 42 tap point. The second NFET N2A 50 has its drain connected to T1A and its gate connected to T2A. When the wave travels to the right, the T2A point is 90 degrees away (later) from the T1A point and when the wave travels to the left, the T2A point is 270 degrees away from the T1A point. The sources of N1A 48 and N2A 50 are connected to a switch SWA 52 that connects, when closed, each of the drains to a current source, I1A 54, I2A 56. The switch SWA 52 has an enable input ENA 46 that makes the right side pair 40 operative. A capacitor CA 58 is connected between the two current sources 54, 56 and, in combination with the transistors N1A 48 and N2A 50, creates a 90 degree delay to full conduction of the N2A 50 FET. The capacitor 58 itself provides a 45 degree delay and the timing of the signals connected to the gates of T1A and T2A provides an additional 45 degrees, for a total of 90 degrees.

The left side pair 38 includes two NFETS N1B 62, N2B 64. The first NFET N1B 64 has its gate connected to T1B conductor and its drain connected to the T1A conductor. The second NFET N2B 62 has its drain connected to T1B conductor and its gate connected to the T2B conductor. When the wave travels to the left, the T2B point is 270 degrees delayed from the T1B point, because it travels past the crossover CO 22 in FIG. 2A. When the wave travels to the right, the T2B point is 90 degrees delayed from the T1B point. The sources of the NFETS are connected to a switch SWB 66 that connects, when closed, each of the drains to a current source I1B 68, I2B 70. The switch SWB 66 has an enable input ENB 44 that makes the left side pair 38 operative. A capacitor CB 72 is connected between the two current sources 68, 70 and in combination with the transistors N1B 64 and N2B 62 creates a 90 degree delay to full conduction of the N2B 62 FET. The capacitor 72 itself provides a 45 degree delay and the timing of the gate signals provides an additional 45 degrees, for a total of 90 degrees.

For the operation of the right side pair 40 of transistors, there are two cases to consider, R1(0+$\overrightarrow{90}$,+90) and D1(0+$\overrightarrow{270}$,+90). For the operation of the left side pair 38 of transistors, the two cases are R2(180+$\overrightarrow{270}$,+90) and D2(180+$\overrightarrow{90}$,+90).

In the R1(0+$\overrightarrow{90}$,+90) case, with the 0 degree wavefront traveling clockwise (not passing the crossover), the N2A 50 transistor provides energy to the traveling wave. This occurs because the drain of the N2A transistor is connected to T1 while the gate is connected to T2, thereby making the drain relatively more negative than the gate. The current source I2A 56 is thus connected via N2A to the negative side of the wave so that it makes the negative side more negative, thereby adding to the energy of the wave.

In the D1(0+$\overrightarrow{270}$,+90) case, with the 0 degree wavefront traveling counter clockwise (passing the crossover), the N2A 50 transistor takes energy from the traveling wave. This occurs because the drain and gate are at the same potential. The current source I2A 56 is thus connected via N2A 50 to the more positive side of the wave so that it makes the positive side more negative, thereby removing energy from the wave.

In the R2(180+$\overrightarrow{270}$,+90) case, with the 180 degree wavefront traveling counter clockwise (passing the crossover), the N2B transistor 62 provides energy to the traveling wave. This occurs because the drain of N2B 62 is connected to T1 while the gate is connected to T2, thereby making the drain relatively more negative than the gate. The I2B current source 68 is thus connected via N2B 62 to the relatively more negative side of the wave, so that it adds energy to the wave.

In D2(180+$\overrightarrow{90}$,+90) case, with the 180 degree wavefront traveling clockwise, the N2B 62 transistor removes energy from the traveling wave. This occurs because the drain and gate of N2B 62 are at the same potential (both relatively positive). The current source I2B 68 is connected via N2B 62 to the more positive side of the wave so that it makes this side of the wave more negative, thereby removing energy from the wave.

In the D1 and D2 cases, the degeneration of the wave is greater than any regeneration of the wave provided by the load devices and the wave thus decays to the point where no wave traveling in the direction for which degeneration occurs. As mentioned above, the degeneration is greater because the NMOS transistor N1B 64 or N2B 62 is stronger than either of the PMOS transistors 34, 36.

A wave traveling on the rotary traveling wave oscillator may be reversed. If a wave is traveling in the clockwise direction, according to R1, and it is desired to have the wave travel in the counter clockwise direction, then the right side pair 40 is turned off and the left side pair 38 is turned on. This, in effect, causes a change from the R1 case to the D2 case, and then to the R2 case. The wave traveling in the clockwise direction is degenerated according to the D2 case, and a new wave starts in the counter clockwise direction according to case R2.

Alternatively, if the wave is traveling in the counter clockwise direction, according to the R2 case and it is desired to have the wave travel in the clockwise direction, then the left side pair 38 is turned off and the right side pair 40 is turned on. This causes a change from the R2 to the D1 case, and then to the R1 case. The change from the R2 case to the D1 case degenerates the wave and a new wave starts in the clockwise direction according to the R1 case.

Alternatively, it is possible to establish a wave traveling in a preferred direction.

If only one of the transistor pairs is present, a wave can be established in a preferred direction by the pair that is present. If the right side pair 40 is present, the pair 40 establishes a traveling wave in the clockwise direction. If the left side pair 38 is present, the pair 38 establishes a traveling wave in the counterclockwise direction.

Figure 4:
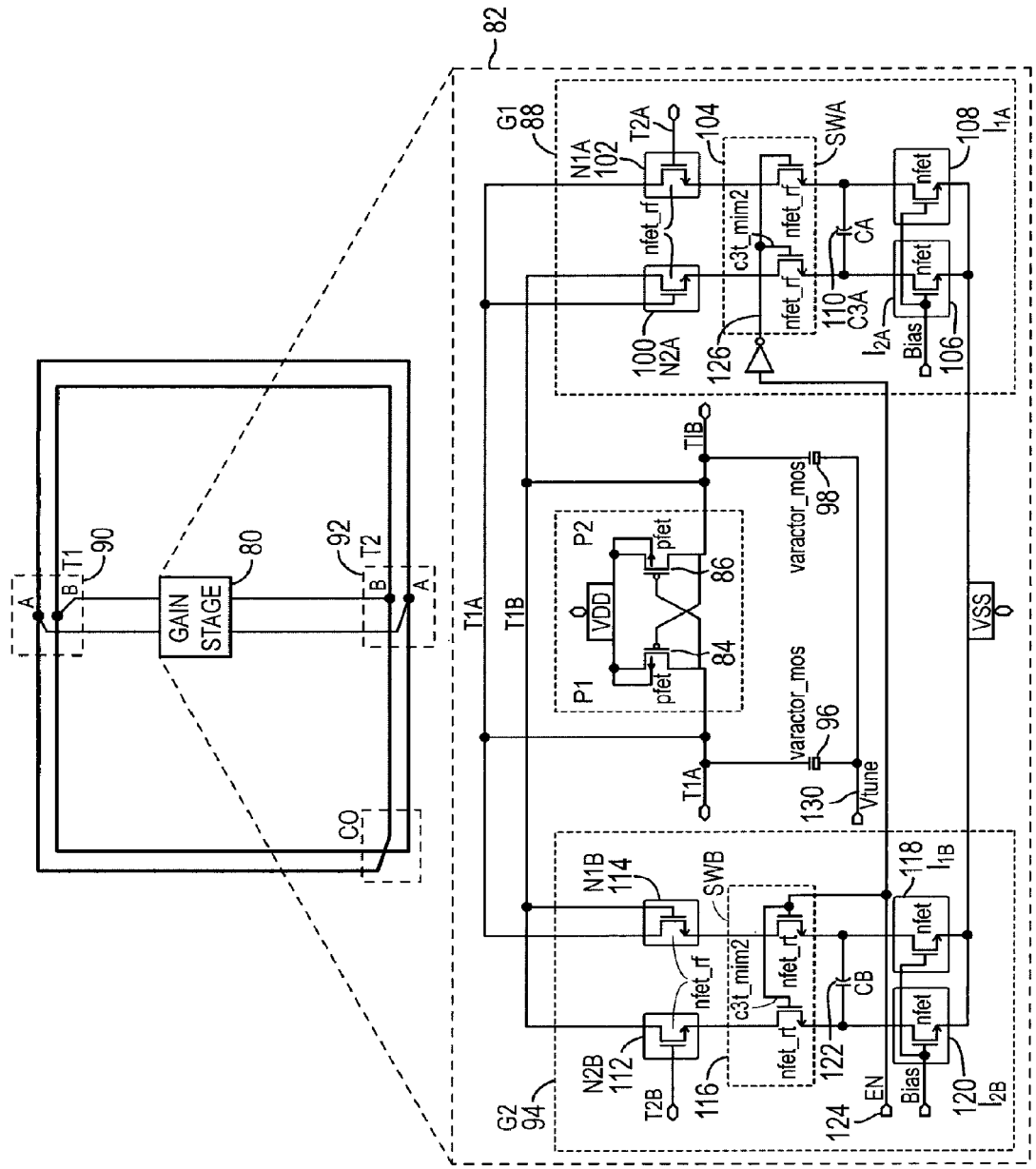
FIG. 4 shows a more detailed schematic of an embodiment of the present invention.

FIG. 4 shows a more detailed diagram of the new wave reversing elements. In this figure, the rotary clock has an exemplary gain stage connected between the T1 point and the T2 point. The rotary clock has a single crossover shown between T1 and T2. The T2 A and B points may be slightly different from 90/270 degrees to compensate for any parasitic capacitances in the circuit.

The exemplary gain stage 80 shown in the figure represents one or more gain stages connected in a similar fashion to the rotary oscillator. The exemplary gain stage 80 has an expanded version shown in the inset 82 and includes the P1 84 and P2 86 FETs, a gain stage portion G1 88 connected to the A and B conductors of the T1 tap 90 and to the A conductor of the T2 tap 92, a gain stage portion G2 94 connected to the T1 tap 90 and to the B conductor of the T2 tap 92, and a pair of varactors 96, 98 connected to the T1A and T1B points for tuning the oscillator. The P1 84 and P2 86 FETs are connected in a cross-coupled fashion and switch when the traveling wave arrives at the T1 tap 90. The G1 stage 88 includes N1A 100 and N2A 102 transistors, an enabling switch SWA 104, the I1A 106 and I2A 108 current sources and the capacitor C3A 110. The G2 stage 94 includes N1B 112 and NIB 114 transistors, an enabling switch SWB 116, the I1B 118 and I2B 120 current sources, and the capacitor C3B 122. The P1 and P2 84, 86 transistors are weaker than the N1B 114 and N2B 112 transistors, so that the degeneration of an existing wave is possible. In one embodiment, the transistors are ⅓ weaker than the NIB 114 and N2B 112 transistors.

The SWA 104 and SWB 116 switches include a pair of NFET transistors whose gates are connected to enable signals, ENA 126 and ENB 124, respectively. In one embodiment, the enable signal ENA 126 of the SWA 104 switch is the inversion of the enable signal ENB 124 of the SWB 116 switch. The current sources 106, 108, 118, 120 are implemented with NFETs and a voltage vb2, vb3 biases these NFETs for constant current. The capacitors C3A 110 and C3B 122 are sized to delay the turning on of either the N2A 100 and N2B 112 transistors by 45 degrees in addition to the 45 degree delay caused by the gates being out of phase by 90 degrees. The varactors 96, 98 connected at the T1 tap point are both connected to a $V_{TUNE}$ voltage 130. This helps to adjust the frequency of the rotary oscillator. Operation of FIG. 4 is substantially the same as that described in relation to FIG. 3.

Rotary Traveling Wave Oscillator

Figure 5:
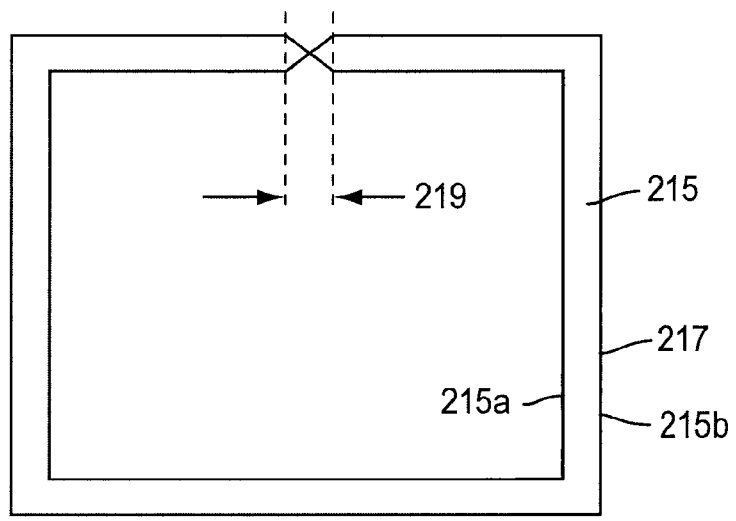
FIG. 5 is an outline diagram for a transmission-line structure hereof.

FIG. 5 shows such a transmission-line 15 as a structure that is further seen as physically endless, specifically comprising a single continuous "originating" conductor formation 217 shown forming two appropriately spaced generally parallel traces as loops 215a, 215b with a cross-over at 219 that does not involve any local electrical connection of the conductor 217. Herein, the length of the originating conductor 217 is taken as S, and corresponds to two 'laps' of the transmission-line 215 as defined between the spaced loop traces 215a, 215b and through the cross-over 219.

Figure 6:
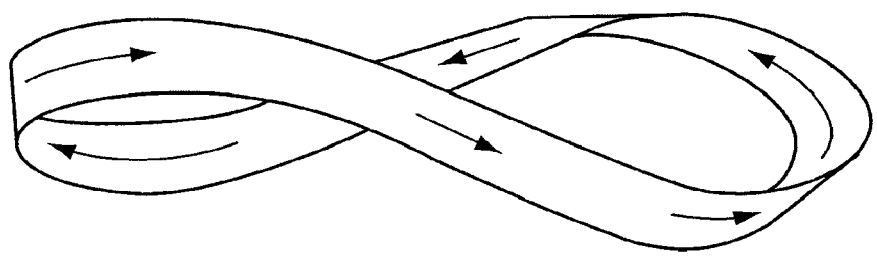
FIG. 6 shows a Moebius strip.

This structure of the transmission-line 215 has a planar equivalence to a Moebius strip, see FIG. 6, where an endless strip with a single twist through 180° has the remarkable topology of effectively converting a two-sided and two-edged, but twisted and ends-joined, originating strip to have only one side and one edge, see arrows endlessly tracking the centre line of the strip. From any position along the strip, return will be with originally left- and right-hand edges reversed, inverted or transposed. The same would be true for any odd number of such twists along the length of the strip. Such a strip of conductive material would perform as required for signal paths of embodiments of this invention, and constitutes another structural aspect of invention. A flexible substrate would allow implementing a true Mobius strip transmission-line structure, i.e. with graduality of twist that could be advantageous compared with planar equivalent cross-over 19. A flexible printed circuit board so formed and with its ICs mounted is seen as a feasible proposition.

Figure 7:
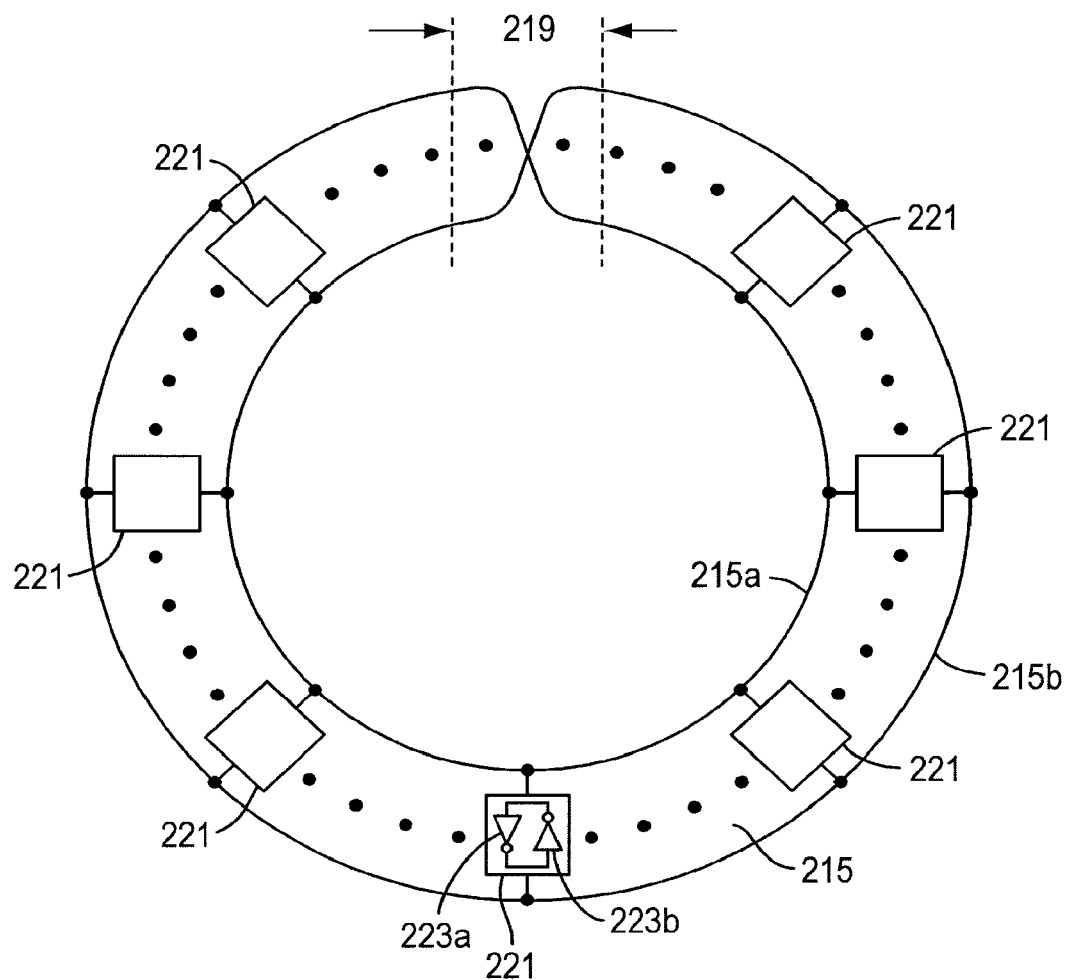
FIG. 7 is an outline circuit diagram for a traveling wave oscillator hereof.

FIG. 7 is a circuit diagram for a pulse generator, actually an oscillator, using the transmission-line 215 of FIG. 5, specifically further having plural spaced regenerative active means conveniently as bi-directional inverting switching/amplifying circuitry 221 connected between the conductive loop traces 215a, 215b. The circuitry 221 is further illustrated in this particular embodiment as comprising two inverters 223a, 223b that are connected back-to-back. Alternatives regenerative means that rely on negative resistance, negative capacitance or are otherwise suitably non-linear, and regenerative (such as Gunn diodes) or are of transmission-line nature. It is preferred that the circuitry 221 is plural and distributed along the transmission-line 215, further preferably evenly, or substantially evenly; also in large numbers say up to 100 or more, further preferably as many and each as small as reasonably practical.

Inverters 223a, 223b of each switching amplifier 221 will have the usual operative connections to relatively positive and negative supply rails, usually V+ and GND, respectively. Respective input/output terminals of each circuit 221 are shown connected to the transmission-line 215 between the loops 215a, 215b at substantially maximum spacing apart along the effectively single conductor 217, thus each at substantially halfway around the transmission-line 215 relative to the other.

Figure 8:
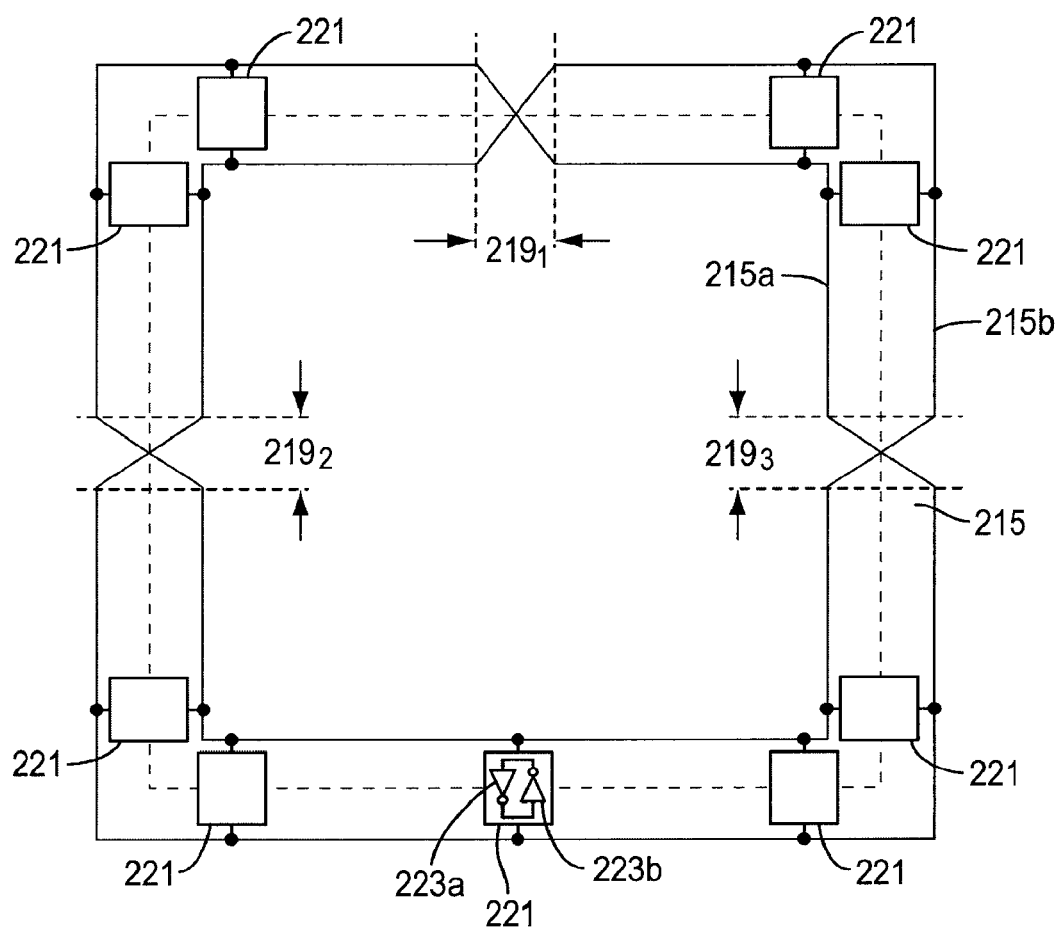
FIG. 8 is another outline circuit diagram for a traveling wave oscillator hereof.

FIG. 8 is another circuit diagram for an oscillator using a transmission-line structure hereof, but with three cross-overs $219_1$, $219_2$ and $219_3$, thus the same Moebius strip-like reversing/inverting/transposing property as applies in FIG. 7.

The rectangular and circular shapes shown for the transmission-line 215 are for convenience of illustration. They can be any shape, including geometrically irregular, so long as they have a length appropriate to the desired operating frequency, i.e. so that a signal leaving an amplifier 221 arrives back inverted after a full 'lap' of the transmission-line 215, i.e. effectively the spacing between the loops 215a, b plus the crossover 219, traversed in a time Tp effectively defining a pulse width or half-cycle oscillation time of the operating frequency.

Advantages of evenly distributing the amplifiers 221 along the transmission-line 215 are twofold. Firstly, spreading stray capacitance effectively lumped at associated amplifiers 221 for better and easier absorbing into the transmission-line characteristic impedance Zo thus reducing and signal reflection effects and improving poor waveshape definition. Secondly, the signal amplitude determined by the supply voltages V+ and GND will be more substantially constant over the entire transmission-line 215 better to compensate for losses associated with the transmission-lines dielectric and conductor materials. A continuous closed-loop transmission-line 215 with regenerative switching means 221 substantially evenly distributed and connected can closely resemble a substantially uniform structure that appears the same at any point.

A good rule is for elementary capacitance and inductance (Ce and Le) associated with each regenerative switching means and forming a resonant shunt tank LC circuit to have a resonant frequency of $1/(2\pi\sqrt{L_e C_e})$ that is greater than the self-sustaining oscillating frequency F (F3, F5 etc.) of the transmission-line 215.

Figure 9A:
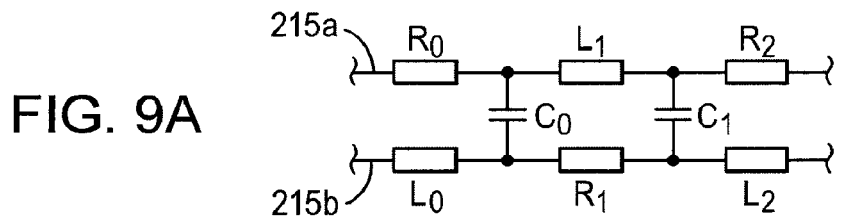
FIGS. 9a and 9b are equivalent circuits for distributed electrical models of a portion of a transmission-line hereof.

FIG. 9a is a distributed electrical equivalent circuit or model of a portion of a transmission-line 215 hereof. It shows alternate distributed resistive (R) and inductive (L) elements connected in series, i.e. $R_0$ connected in series with $L_1$ in turn connected in series with $R_2$ and so on for a portion of loop 215a, and registering $L_0$ connected in series with $R_1$ in turn connected in series with $L_2$ and so on for the adjacent portion of loop 215b; and distributed capacitive elements $C_0$ and $C_1$ shown connected in parallel across the transmission-line 15 thus to the loops 215a and 215b between the resistive/inductive elements $R_0/L_1$ and the inductive/resistive elements $L_0/R_1$, respectively for $C_0$ and between the inductive/resistive elements $L_1/R_2$ and the resistive/inductive elements $R_1/L_2$, respectively for $C_1$: where the identities $R_0=R_1=R_2$, $L_0=L_1=L_2$ and $C_0=C_1$ substantially hold and the illustrated distributed RLC model extends over the whole length of the transmission-line 215. Although not shown, there will actually be a parasitic resistive element in parallel with each capacitive element C, specifically its dielectric material.

Figure 9B:
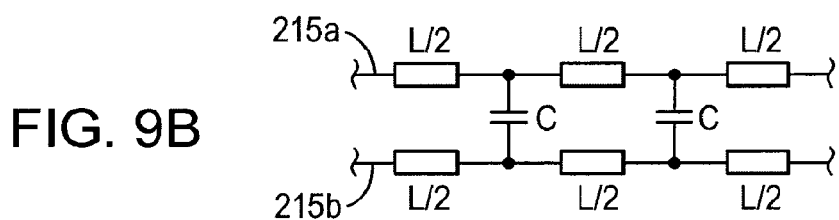

FIG. 9b is a further simplified alternative distributed electrical equivalent circuit or model that ignores resistance, see replacement of those of FIG. 9a by further distribution of inductive elements in series at half (L/2) their value (L) in FIG. 9a. This model is useful for understanding basic principles of operation of transmission-lines embodying the invention.

During a 'start-up' phase, i.e. after power is first applied to the amplifiers 221, oscillation will get initiated from amplification of inherent noise within the amplifiers 221, thus begin substantially chaotically though it will quickly settle to oscillation at a fundamental frequency F, typically within nanoseconds. For each amplifier 221, respective signals from its inverters 223a and 223b arrive back inverted after experiencing a propagation delay Tp around the transmission-line 215. This propagation delay Tp is a function of the inductive and capacitive parameters of the transmission-line 215; which, as expressed in henrys per meter (L) and in farads per meter (C) to include all capacitive loading of the transmission-line, lead to a characteristic impedance Zo=SQR (L/C) and a line traverse or propagation or phase velocity–Pv=1/SQRT(L/C). Reinforcement, i.e. selective amplification, of those frequencies for which the delay Tp is an integer sub-divisor of a half-cycle time gives rise to the dominant lowest frequency, i.e. the fundamental frequency F=1/(2·Tp), for which the sub-divisor condition is satisfied. All other integer multiples of this frequency also satisfy this sub-divisor condition, but gain of the amplifiers 21 'falls off', i.e. decreases, for higher frequencies, so the transmission-line 215 will quickly settle to fundamental oscillation at the frequency F.

The transmission-line 215 has endless electromagnetic continuity, which, along with fast switching times of preferred transistors in the inverters 223a and 223b, leads to a strongly square wave-form containing odd harmonics of the fundamental frequency F in effectively reinforced oscillation. At the fundamental oscillating frequency F, including the odd harmonic frequencies, the terminals of the amplifiers 221 appear substantially unloaded, due to the transmission-line 215 being 'closed-loop' without any form of termination, which results very desirably in low power dissipation and low drive requirements. The inductance and capacitance per unit length of the transmission-line 215 can be altered independently, as can also be desirable and advantageous.

Figure 10:
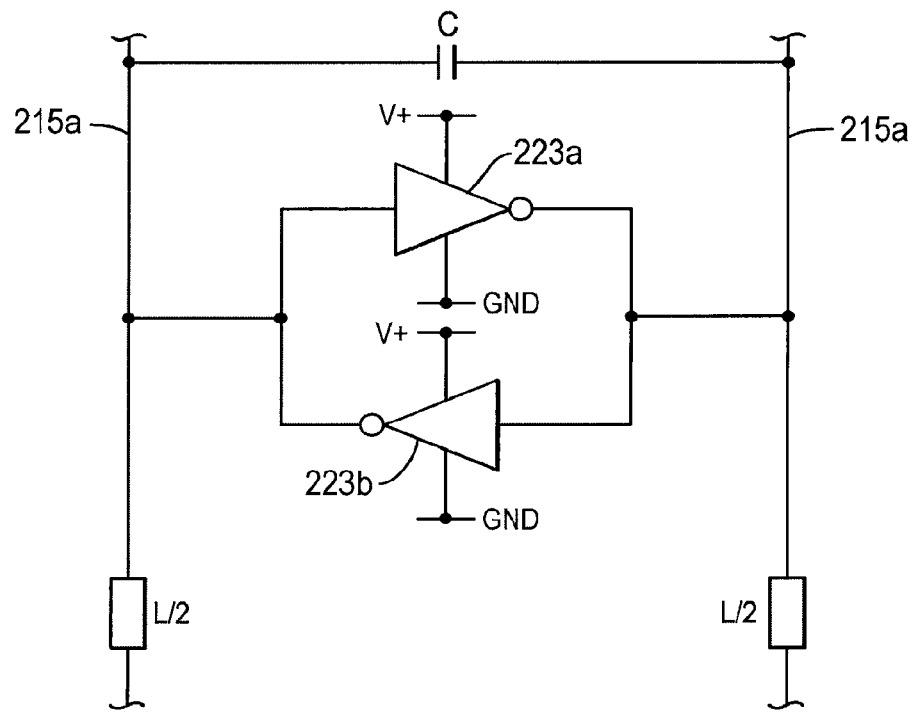
FIG. 10 shows a pair of back-to-back inverters connected across part of a transmission-line.

FIG. 10 shows a pair of back-to-back inverters 223a, 223b with supply line connectors and indications of distributed inductive (L/2) and capacitive (C) elements of a transmission-line as per FIG. 9b.

Figure 11A:
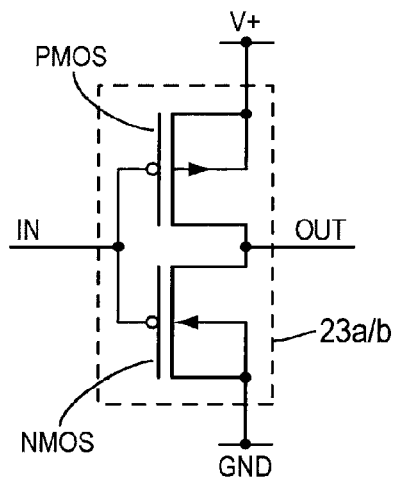
FIGS. 11a and 11b are outline and equivalent circuit diagrams of CMOS back-to-back inverters.

FIG. 11a shows N-channel and P-channel Mosfet implementation of the back-to-back inverters 223a and 223b, see out of NMOS and PMOS transistors.

Figure 11B:
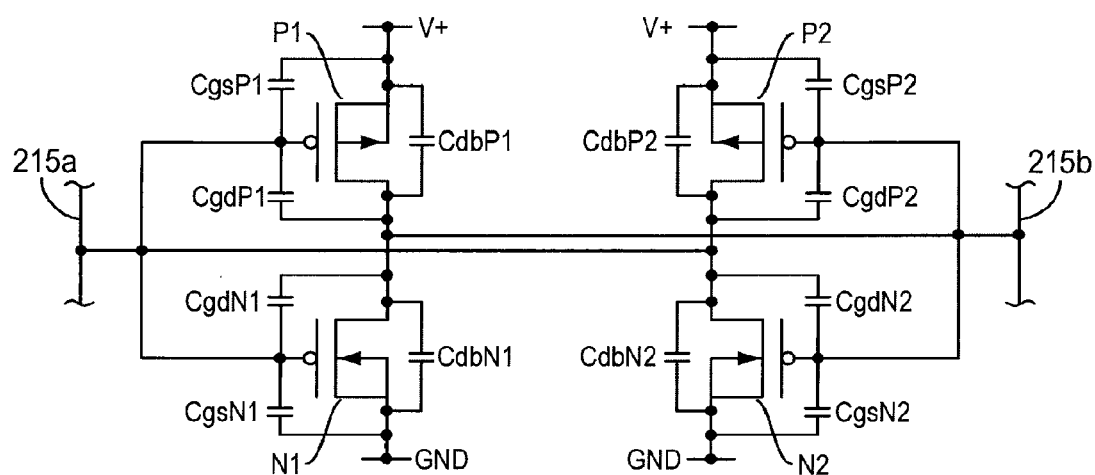

FIG. 11b shows an equivalent circuit diagram for NMOS (N1, N2) and PMOS (P1, P2) transistors, together with their parasitic capacitances. The gate terminals of transistors P1 and N1 are connected to the conductive trace 215a and to the drain terminals of transistors P2 and N2. Similarly, the gate terminals of transistors P2 and N2 are connected to the conductive trace 215b and to the drain terminals of transistors P1 and N1. The PMOS gate-source capacitances CgsP1 and CgsP2, the PMOS gate-drain capacitances CgdP1 and CgdP2, and the PMOS drain-source and substrate capacitances CdbP1 and CdbP2, also the NMOS gate-source capacitances CgsN1 and CgsN2, the NMOS gate-drain capacitances CgdN1 and CgdN2, and the NMOS drain-source and substrate capacitances CdbN1 and CdbN2 are effectively absorbed into the characteristic impedance Zo of the transmission-line, so have much less effect upon transit times of the individual NMOS and PMOS transistors. The rise and fall times of the waveforms Φ1 and Φ2 are thus much faster than for prior circuits.

Although the present invention has been described in considerable detail with reference to certain preferred versions thereof, other versions are possible. Therefore, the spirit and scope of the appended claims should not be limited to the description of the preferred versions contained herein.

What is claimed is:

1. An apparatus comprising:
    a differential transmission line in a closed loop, the differential transmission line including a first conductive trace, a second conductive trace, and an odd number of one or more cross-overs, wherein each of the one or more cross-overs is configured to reverse a polarity of a wave propagating through the differential transmission line; and
    one or more wave direction control circuits connected between the first and second conductive traces, wherein the one or more wave direction control circuits comprise a first wave direction control circuit comprising:
        a first gain circuit configured to degenerate a wave propagating in a first direction and to regenerate a wave propagating in a second direction; and
        a second gain circuit configured to degenerate a wave propagating in the second direction and to regenerate a wave propagating in the first direction.

2. The apparatus of claim 1, wherein the first wave direction control circuit further comprises a first switch configured to selectively activate the first gain circuit and a second switch configured to selectively activate the second gain circuit, wherein a state of the first and second switches controls a direction of a wave propagating through the differential transmission line.

3. The apparatus of claim 2, wherein the first switch and second switches are configured such that only one of the first or second gain circuits is active at a time.

4. The apparatus of claim 1, wherein the first gain circuit comprises a first transistor and a second transistor, wherein a gate of the first transistor and a drain of the second transistor are connected to the first conductive trace at a first tap point of the differential transmission line, and wherein a drain of the first transistor is connected to the second conductive trace at the first tap point, and wherein a gate of the second transistor is connected to the first conductive trace at a second tap point of the differential transmission line.

5. The apparatus of claim 4, wherein the second gain circuit comprises a third transistor and a fourth transistor, wherein a gate of the third transistor is connected to the second conductive trace at the second tap point, and wherein a gate of the fourth transistor and a drain of the third transistor are connected to the second conductive trace at the first tap point, and wherein a drain of the fourth transistor is connected to the first conductive trace at the first tap point.

6. The apparatus of claim 5, wherein the first wave direction control circuit further comprises a first switch coupled to a source of the first transistor and to a source of the second transistor, and wherein the second wave direction control circuit further comprises a second switch coupled to a source of the third transistor and to a source of the fourth transistor.

7. The apparatus of claim 4, wherein a phase difference between the first and second taps is different when a wave propagates in the second direction relative to when a wave propagates in the first direction.

8. The apparatus of claim 7, wherein the phase difference between the first and second taps is about 90 degrees when a wave propagates in the second direction, and wherein phase difference between the first and second taps is about 270 degrees when a wave propagates in the first direction.

9. The apparatus of claim 4, further comprising a first load device connected to the first conductor at the first tap point and a second load device connected to the second conductor at the second tap point.

10. The apparatus of claim 9, wherein the first load device comprises a first load transistor and the second load device comprises a second load transistor, wherein the first and second load transistors are cross-coupled.

11. An apparatus comprising:
a differential transmission line in a closed loop, the differential transmission line including a first conductive trace, a second conductive trace, and an odd number of one or more cross-overs, wherein each of the one or more cross-overs is configured to reverse a polarity of a wave propagating through the differential transmission line; and
one or more wave direction control circuits connected between the first and second conductive traces, wherein the one or more wave direction control circuits comprise a first wave direction control circuit comprising:
a first means for controlling gain configured to degenerate a wave propagating in a first direction and to regenerate a wave propagating in a second direction; and
a second means for controlling gain configured to degenerate a wave propagating in the second direction and to regenerate a wave propagating in the first direction.

12. An apparatus comprising:
a differential transmission line in a closed loop, the differential transmission line including a first conductive trace, a second conductive trace, and an odd number of one or more cross-overs, wherein each of the one or more cross-overs is configured to reverse a polarity of a wave propagating through the differential transmission line;
a first pair of transistors comprising a first transistor and a second transistor, wherein a gate of the first transistor is connected to the first conductive trace at a first tap point of the differential transmission line, and wherein a gate of the second transistor is connected to the first conductive trace at a second tap point of the differential transmission line, and wherein when activated, the first pair of transistors degenerates a wave propagating in a first direction and regenerates a wave propagating in a second direction; and
a second pair of transistors comprising a third transistor and a fourth transistor, wherein a gate of the third transistor is connected to the second conductive trace at the second tap point, and wherein a gate of the fourth transistor is connected to the second conductive trace at the first tap point, and wherein when activated, the second pair of transistors degenerates a wave propagating in the second direction and regenerates a wave propagating in the first direction.

13. The apparatus of claim 12, wherein a drain of the second transistor and a drain of the fourth transistor are connected to the first conductive trace at the first tap point, and wherein a drain of the first transistor and a drain of the third transistor are connected to the second conductive trace at the first tap point.

14. The apparatus of claim 12, further comprising a first switch coupled to a source of the first transistor and to a source of the second transistor, and a second switch coupled to a source of the third transistor and to a source of the fourth transistor.

15. The apparatus of claim 14, wherein the first switch and second switches are configured such that only one of the first or second pairs of transistors is active at a time.

16. The apparatus of claim 14, wherein the first switch comprises a third pair of transistors and the second switch comprises a fourth pair of transistors.

17. The apparatus of claim 14, wherein the first switch is configured to selectively activate the first pair of transistors by controlling a flow of current through the first pair of transistors, and wherein the second switch is configured to selectively activate the second pair of transistors by controlling a flow of current through the second pair of transistors.

18. The apparatus of claim 12, wherein a phase difference between the first and second taps is different when a wave propagates in the second direction relative to when a wave propagates in the first direction.

19. The apparatus of claim 12, further comprising a first load device connected to the first conductor at the first tap point and a second load device connected to the second conductor at the second tap point.

* * * * *